United States Patent
Klein

(10) Patent No.: US 9,755,585 B1
(45) Date of Patent: Sep. 5, 2017

(54) HIGH POWER RADIO FREQUENCY AMPLIFIER WITH DYNAMIC DIGITAL CONTROL

(71) Applicant: Joseph Klein, Chatsworth, CA (US)

(72) Inventor: Joseph Klein, Chatsworth, CA (US)

(73) Assignee: AERO ANTENNA, INC., Chatsworth, CA (US)

( * ) Notice: Subject to any disclaimer, the term of this patent is extended or adjusted under 35 U.S.C. 154(b) by 0 days.

(21) Appl. No.: 15/256,880

(22) Filed: Sep. 6, 2016

(51) Int. Cl.
| | |
|---|---|
| H03G 3/20 | (2006.01) |
| H03F 1/34 | (2006.01) |
| H03F 3/193 | (2006.01) |
| H03F 3/21 | (2006.01) |

(52) U.S. Cl.
CPC ............ H03F 1/342 (2013.01); H03F 3/193 (2013.01); H03F 3/21 (2013.01); *H03F 2200/102* (2013.01); *H03F 2200/451* (2013.01); *H03F 2200/468* (2013.01)

(58) Field of Classification Search
CPC ....................................................... H03G 3/20
USPC ................................................. 330/129, 136
See application file for complete search history.

(56) References Cited

U.S. PATENT DOCUMENTS

| | | | | |
|---|---|---|---|---|
| 4,574,248 A | * | 3/1986 | Snodgrass ............ | H03G 3/3047 330/134 |
| 5,101,172 A | * | 3/1992 | Ikeda .................... | H03F 1/0238 330/136 |
| 5,726,603 A | | 3/1998 | Chawla et al. | |
| 5,892,397 A | * | 4/1999 | Belcher ................. | H03F 1/3229 330/136 |
| 6,252,455 B1 | * | 6/2001 | Kurby ................... | H03F 1/0222 330/129 |
| 6,593,812 B2 | * | 7/2003 | Sundstrom ............ | H03F 1/3247 327/307 |
| 6,600,368 B2 | * | 7/2003 | Kim ...................... | H03F 1/3252 330/136 |
| 6,703,897 B2 | * | 3/2004 | O'Flaherty ........... | H03F 1/0244 330/107 |
| 6,717,464 B2 | * | 4/2004 | Fudaba ................. | H03F 1/3241 330/136 |
| 7,288,988 B2 | * | 10/2007 | Braithwaite .......... | H03F 1/3247 330/136 |
| 2009/0027119 A1 | * | 1/2009 | Williams .................. | H03F 1/32 330/149 |

* cited by examiner

*Primary Examiner* — Henry Choe

(57) ABSTRACT

The present invention provides an RF power amplifier architecture which with dynamic digital control of the amplification by incorporating digitized RF input and output signal envelope data and environmental temperature sensor(s) readings into an arbitrary control algorithm implemented on a digital processor. Via the combination of digitally controlled DC/DC converter and a D/A converter, the quiescent bias of the power FET of the RF output stage can become a realization of virtually any function of the feedback and input data.

10 Claims, 1 Drawing Sheet

Block diagram of the invention.

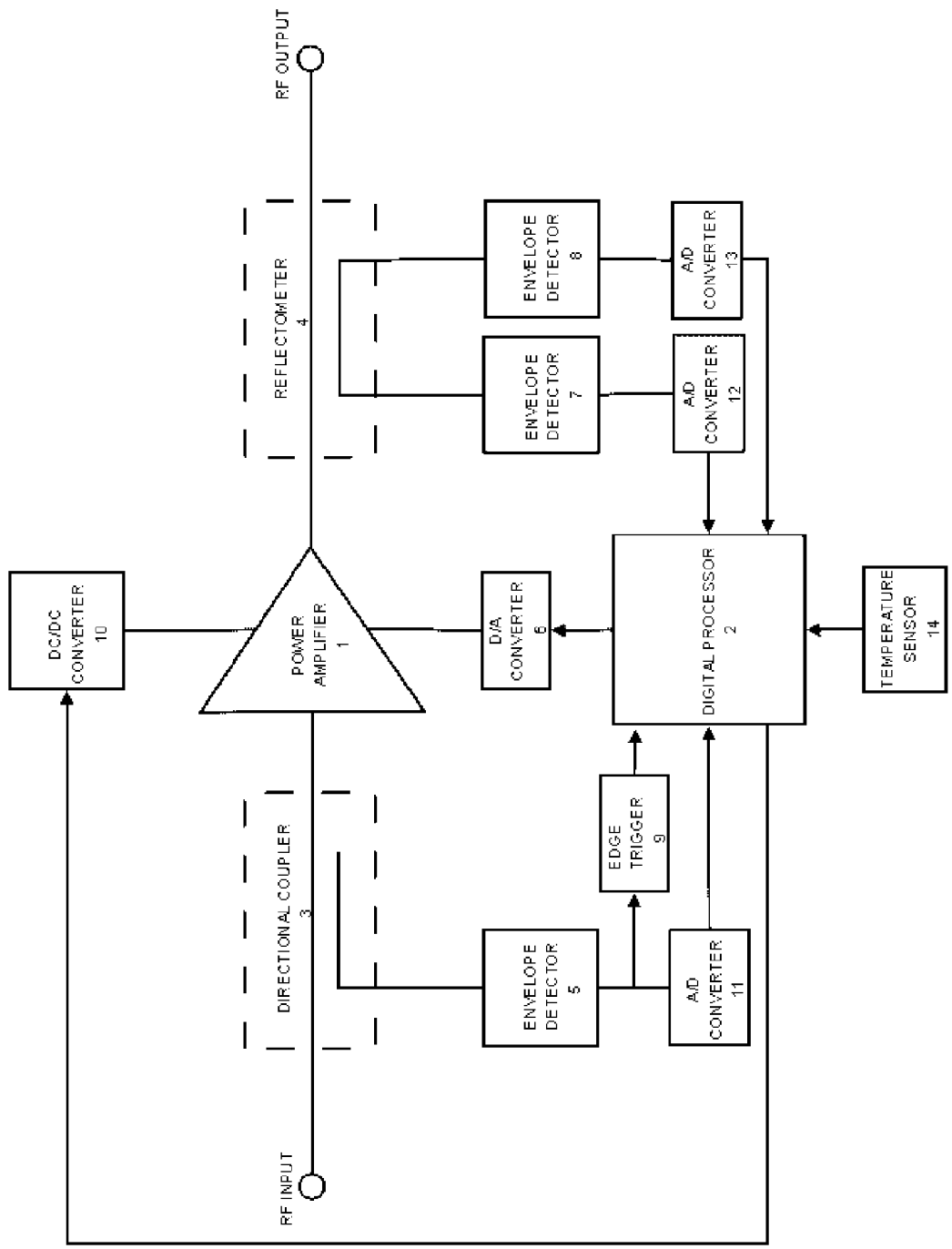
Block diagram of the invention.

HIGH POWER RADIO FREQUENCY AMPLIFIER WITH DYNAMIC DIGITAL CONTROL

FIELD OF THE INVENTION

The present invention relates to feedback control of power amplifiers, more specifically power amplifiers having digital feedback control.

BACKGROUND OF THE INVENTION

In general, feedback control is desired in electrical amplification systems. If a power amplification system is designed without the use of feedback control, the quality requirements for its components become more demanding driving the cost and production complexity up. In addition, in a fixed biased amplifier [1], where the output power stage bias depends only weakly on the instantaneous input power level, the average power amplifier efficiency may be too low due to the stage being turned on even in an absence of the input signal. A common trade off for efficiency is linearity, which is seldom an acceptable sacrifice in power amplifiers designed for use in modern communication systems. Some previously described systems use transmit keying functionality [2], which does increase the average efficiency of an amplifier but it relies on additional synchronization mechanisms external to the amplifier and additional control lines. This limits the general use of the amplifier product, since it requires the transmitter to have proper transmit keying compatibility. Other RF power amplifiers, such as the one described in [3], utilize thermal properties of components to de-couple the amplifier transfer function from the operating environment temperature dependency. However, this technique ties the response to temperature variation to that of the components used and does not allow arbitrarily flexible control functions without the circuit hardware change.

SUMMARY OF THE INVENTION

The present invention provides a new RF power amplifier architecture which with dynamic digital control of the amplification by incorporating digitized RF input and output signal envelope data and environmental temperature sensor(s) readings into an arbitrary control algorithm implemented on a digital processor. Via the combination of digitally controlled DC/DC converter and a D/A converter, the quiescent bias of the power FET of the RF output stage can become a realization of virtually any function of the feedback and input data. For example, a constant output power level can be kept for a given input power level and the Power Out vs. Power In response can be preprogrammed as an arbitrary waveform data. The architecture presented by this invention can achieve the same goal as the transmit keying technique does without the need of separate control lines since only the the input signal dynamics are used as the control assertion. The RF power amplifier can be turned off or put into a lower power idle state if there is no signal present at its input. An edge trigger is included for the envelope detector. It can be utilized in cases where either the A/D conversion rate or the algorithm processing rate cannot sustain the signal envelope dynamics. If the input signal envelope is too short, the edge trigger can command the digital processor to set some predefined bias condition before processing the feedback data thus making the system response quicker.

An architecture of a High Power Radio Frequency Amplifier with Dynamic Digital Control is presented. The RF input power, RF output power, RF power reflected from the load connected to the RF Output port, and circuit temperature are sampled, digitized, and then processed by a digital processor. The processor controls the Power Amplifier bias by setting the gate (via D/A Converter) and drain voltages (by controlling the DC/DC Converter) on the power FET of the output stage. This allows to obtain full dynamic control of such key parameters as gain, linearity, and amplifier efficiency and provides the possibility of dynamic reconfiguration of the amplifier to accommodate for different trade-off modes. The presence of Temperature Feedback mechanism allows for the implementation of temperature compensating algorithms. Moreover, the same hardware architecture may be used in different products with characteristics redefined by software/firmware greatly reducing the time and the cost of development. In addition, arbitrary input to output power relationship can be achieved providing greater stability and control flexibility.

BRIEF DESCRIPTION OF THE DRAWINGS

FIG. 1 is a high level block diagram of the method and structure of the present invention.

DETAILED DESCRIPTION OF THE INVENTION

The invention is now discussed with reference to the figures.

The block diagram of the presented invention reflecting the architecture embodiment is illustrated in FIG. 1. The amplifier 1 receives RF signal at its input and provides amplified RF signal at its output. The input signal is coupled to the envelope detector 5 via a directional coupler 3. This arrangement also helps to minimize the interference caused by impedance mismatches on the amplifier 1 input.

The output of the envelope detector 5 is connected to the input of the A/D (analog to digital) converter 11. The output of the A/D converter is connected to the data input port of the digital processor 2.

In addition, the output of the envelope detector 5 is connected to an edge trigger 9 which provides binary digital output at levels compatible with the digital processor 2 I/O specifications upon envelope detection. The edge trigger 9 output is connected to the input port of the digital processor 2.

A temperature sensor 14 with digitized output is connected to the data input port of the digital processor 2. The amplified RF output signal provided by the amplifier 1 is coupled via the reflectometer 4 into the envelope detector 7 and the envelope detector 8.

The purpose for employing the reflectometer is to split the output RF signal into its forward going (detector 7) and reflected components (detector 8). The forward going portion of the signal can then be used in the output power feedback control while the reflected portion can be used in the reflection feedback for the voltage standing wave ratio (VSWR) magnitude computation.

The output of the envelope detector 7 is connected to the input of the A/D converter 12. The output of the A/D converter 12 is connected to the digital data port of the digital processor 2.

The output of the envelope detector 8 is connected to the input of the A/D converter 13. The output of the A/D converter 13 is connected to the digital data port of the digital processor 2.

The signals/data received are made available as inputs for a control algorithm implemented in the digital processor 2, which comprises memory, a microprocessor and a control program for its operation to accomplish the objects of the invention. The digital processor 2 establishes control signals for the D/A converter 6 and DC/DC converter 10 according to the provided control algorithm. The output of the D/A converter 6 is available on the gate terminal of a power FET of the output stage while the output of the DC/DC converter 10 is available on the drain terminal of a power FET of the output stage.

With the realization of the presented invention into a physical electronic system, the value of the amplitude of the output RF power as a function of sampled parameters is established by the actual algorithm implemented on the digital processor 2. However, the general functionality intended for the invented RF amplifier architecture in the following specific example:

The power amplifier 1 is kept in a low power mode by adjusting the D/A converter 6 output to a minimum while no RF input signal is detected by the envelope detector 5. Upon the detection of the RF input signal by the envelope detector 5, the bias to the power FET of the output power stage is adjusted to the minimum required to produce the appropriate amplified output RF power signal via the D/A converter 6 and the DC/DC converter 10. The operational relationship of the output RF power and the control parameters can be expressed as follows:

$$P_{RFOUT} = P_{RFIN} G(P_{RFIN}, P_{RFFWD}, P_{RFREV}, T_{ENV}) \delta_{ENV}$$

Where P sub.RFIN.sub is the input RF power, P sub.RFFWD.sub is the forward-going RF output power, P sub.RFREV.sub is the reverse-going (reflected) output power, T sub.ENV.sub is the environment temperature. The term delta sub.ENV.sub the gating function realized by the edge trigger 9:

$$\delta_{ENV} = \left\{ \begin{array}{l} 1, \text{ envelope detected} \\ 0, \text{ otherwise} \end{array} \right\}$$

The algorithms implemented on the digital processor 2 define the gain function G, which need not be neither linear nor continuous. For example, a special case of a discontinuous piece-wise G can be implemented in a form of a look-up table in memory for a set of ranges of P sub.RFINO.sub. While establishing the bias control signals, the input signals/data from the temperature sensor 14 and the envelope detector 8 (VSWR) can be utilized to decrease the probability of damaging the amplifier due to overheating or power FET drain over-voltage due to high VSWR. If the value of the signal sampled by the A/D converter 13 exceeds the threshold corresponding to dangerous VSWR levels, the D/A converter 6 output shall be reduced by the digital processor 2 thus reducing the power FET gate bias level and limiting the RF signal amplification. The same shall be done if the temperature sensed by the temperature sensor 14 is at an overheat level. If a quicker control response is required by the application, a preset voltage level on the D/A converter 6 maybe enabled (turned on or activated) by a signal produced by the edge trigger 9.

In a general sense, novel concepts of the present invention comprise:

1. An overall architectural arrangement of the invention high power RF amplifier with dynamic digital control whereby the sensing circuitry comprised of the directional coupler 3, the reflectometer 4, the envelope detector 5, the envelope detector 7, the envelope detector 8, the edge trigger 9, the A/D converter 11, the A/D converter 12, the A/D converter 13, and the temperature sensor 14 is fed back into the digital processor 2.

2. The overall architectural arrangement of the high power RF amplifier with dynamic digital control whereby the output stage bias circuitry of the amplifier comprised of the D/A converter 6 and the DC/DC converter 10 is coupled to the gate terminal and the drain terminal of the power FET, respectively, and is controlled by the digital processor 2.

3. The overall architectural arrangement of the high power RF amplifier with dynamic digital control whereby an arbitrary algorithm can be implemented which defines the operational relationship of the output RF power and the control parameters according to the following equation:

$$P_{RFOUT} = P_{RFIN} G(P_{RFIN}, P_{RFFWD}, P_{RFREV}, T_{ENV}) \delta_{ENV}$$

REFERENCES

[1] Thomas H. Lee, "Planar Microwave Engineering", Cambridge University Press., pp. 631-640, 2004
[2] Thomas W. Hull, Antonio Pagnamenta, "Radio Frequency Signal Power Amplifier", U.S. Pat. No. 54,367,443, Jan. 4, 1983
[3] Yogendra K. Chawla, Leonid Reyzelman, "Linear RF Power Amplifier", U.S. Pat. No. 5,726,603, Mar. 10, 1998

The above design options will sometimes present the skilled designer with considerable and wide ranges from which to choose appropriate apparatus and method modifications for the above examples. However, the objects of the present invention will still be obtained by that skilled designer applying such design options in an appropriate manner.

I claim:

1. A method of controlling the output power of an RF power amplifier comprising:

A. inputting an RF input signal to a directional coupler device, which does not affect the RF input signal, which is adapted to detect a signal envelope of the RF input signal and output an analog signal to a first analog/digital converter, whereby first analog/digital converter thereafter outputs a digital envelope signal, and outputs another analog signal to an edge trigger device, which outputs a digital edge trigger signal;

B. inputting the digital envelope signal and the edge trigger signal to a digital processor, which comprises a microprocessor, memory and an operation control program which controls general operation of the digital processor, which further comprises a control algorithm and its associated stored data;

C. the RF power amplifier receives the output of the directional coupler device and acts upon it with an input stage and an output stage, the output stage comprising a power FET having gate and drain terminals, whereupon the RF power amplifier acts upon the RF input signal from the directional coupler to output an amplified RF output signal;

D. the amplified RF output signal passes through a reflectometer device without affecting the amplified RF output signal, detection of an edge of the RF input signal, an edge trigger signal and envelope signal are generated and input to the digital processor, whereupon reflectometer device outputs first detector signals comprising forward going portion of the amplified RF output signal and outputs second detector signals comprising reflected components of the amplified RF output signal, each of which output signals are transformed to digital forms at separate analog to digital converters and thereafter input to the digital processor; and E. the digital processor acts upon inputs by way of the control algorithm to output a digital amplifier signal, which is converted to analog form and input to the gate terminal of a power FET of the output stage, and a further output of a digital DC signal, which is converted to a direct current signal and input to the drain terminal of a power FET of the output stage.

2. The method of claim 1 wherein the edge trigger signal comprises detection of an edge voltage level below a pre-determined minimum stored in the digital processor, whereafter the amplifier signal is minimized for a no input signal mode.

3. The method of claim 1 wherein the digital processor receives as input a temperature sensor signal indicating temperature of the RF power amplifier.

4. The method of claim 1 wherein the digital form of the first detector signal is used by the digital processor to increase or decrease the digital amplifier signal.

5. The method of claim 4 wherein the digital amplifier signal is increased to provide for a pre-determined amplification of the RF input signal at the amplified RF output signal.

6. The method of claim 5 wherein the digital amplifier signal is reduced in response to detection in the digital processor that a temperature sensor signal maximum has been exceeded.

7. The method of claim 5 wherein the digital amplifier signal is reduced in response to detection in the digital processor that a digital envelope signal maximum has been exceeded.

8. The method of claim 5 wherein the digital amplifier signal is reduced in response to detection in the digital processor that a second detector signal maximum has been exceeded.

9. The method of claim 5 wherein the digital amplifier signal is reduced in response to detection in the digital processor that a second detector signal maximum has been exceeded.

10. The method of claim 5 wherein the digital amplifier signal is reduced in response to detection in the digital processor that maximums for the first detector signal and the second detector signal maximum have been exceeded.

* * * * *

UNITED STATES PATENT AND TRADEMARK OFFICE
CERTIFICATE OF CORRECTION

PATENT NO. : 9,755,585 B1  
APPLICATION NO. : 15/256880  
DATED : September 6, 2016  
INVENTOR(S) : Klein et al.

Page 1 of 1

It is certified that error appears in the above-identified patent and that said Letters Patent is hereby corrected as shown below:

On the Title Page

(75) Inventors should read: Joseph Klein, Chatsworth, CA (US);
Alex Sissoev, Chatsworth, CA (US)

Signed and Sealed this
Twenty-sixth Day of December, 2017

Joseph Matal
*Performing the Functions and Duties of the
Under Secretary of Commerce for Intellectual Property and
Director of the United States Patent and Trademark Office*